(12) United States Patent
Frank et al.

(10) Patent No.: US 7,560,361 B2
(45) Date of Patent: Jul. 14, 2009

(54) METHOD OF FORMING GATE STACK FOR SEMICONDUCTOR ELECTRONIC DEVICE

(75) Inventors: Martin M. Frank, New York, NY (US); Alexander Reznicek, Mount Kisco, NY (US); Evgeni P. Gousev, Mahopac, NY (US); Eduard A. Cartier, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 10/917,055

(22) Filed: Aug. 12, 2004

(65) Prior Publication Data

US 2006/0035450 A1    Feb. 16, 2006

(51) Int. Cl.
*H01L 21/447* (2006.01)

(52) U.S. Cl. .................. 438/455; 438/591; 438/287; 257/411; 257/E21.122

(58) Field of Classification Search .............. 438/590, 438/293, 455, 591, 287; 257/411, E21.122
See application file for complete search history.

(56) References Cited

U.S. PATENT DOCUMENTS

| | | | | |
|---|---|---|---|---|
| 5,013,681 A | * | 5/1991 | Godbey et al. | 438/459 |
| 5,882,987 A | * | 3/1999 | Srikrishnan | 438/458 |
| 5,953,620 A | * | 9/1999 | Katou et al. | 438/406 |
| 6,140,210 A | * | 10/2000 | Aga et al. | 438/458 |
| 6,146,979 A | * | 11/2000 | Henley et al. | 438/458 |
| 6,323,108 B1 | * | 11/2001 | Kub et al. | 438/458 |
| 6,335,231 B1 | * | 1/2002 | Yamazaki et al. | 438/151 |
| 6,524,935 B1 | * | 2/2003 | Canaperi et al. | 438/478 |
| 6,770,507 B2 | * | 8/2004 | Abe et al. | 438/64 |
| 6,825,532 B2 | * | 11/2004 | Linn et al. | 257/347 |
| 6,852,645 B2 | * | 2/2005 | Colombo et al. | 438/770 |
| 6,992,025 B2 | * | 1/2006 | Maa et al. | 438/795 |
| 2001/0030354 A1 | * | 10/2001 | Shimizu et al. | 257/627 |
| 2002/0094663 A1 | * | 7/2002 | Kwon et al. | 438/459 |
| 2004/0266117 A1 | * | 12/2004 | Hwang | 438/287 |
| 2005/0042842 A1 | * | 2/2005 | Lei et al. | 438/459 |
| 2005/0124121 A1 | * | 6/2005 | Rotondaro et al. | 438/287 |

OTHER PUBLICATIONS

H. Huff, "High Dielectric Constant Materials," 2005, Springer, pp. 233-237.*
R. Choi et al., "Fabrication of High Quality Ultra-thin HfO2 Gate Dielectric MOSFETs Using Deuterium Anneal," IEDM, 2002, pp. 613-616.*
Choi, Rino, et al., "Fabrication of High Quality Ultra-thin HfO2 Gate Dielectric MOSFETs Using Deuterium Anneal", IEDM 2002 pp. 613-616.

* cited by examiner

*Primary Examiner*—Douglas M Menz
*Assistant Examiner*—Steven J Fulk
(74) *Attorney, Agent, or Firm*—Scully, Scott, Murphy & Presser, P.C.; Lou Percello, Esq.

(57) ABSTRACT

A method of forming a gate stack for semiconductor electronic devices utilizing wafer bonding of at least one structure containing a high-k dielectric material is provided. The method of the present invention includes a step of first selecting a first and second structure having a major surface respectively. In accordance with the present invention, at least one, or both, of the first and second structures includes at least a high-k dielectric material. Next, the major surfaces of the first and second structures are bonded together to provide a bonded structure containing at least the high-k dielectric material of a gate stack.

38 Claims, 1 Drawing Sheet

METHOD OF FORMING GATE STACK FOR SEMICONDUCTOR ELECTRONIC DEVICE

FIELD OF THE INVENTION

The present invention relates to semiconductor electronic devices and systems and more particularly, to a method of fabricating, at least partially, a gate stack of a semiconductor-dielectric-semiconductor device structure such as, for example, a metal oxide semiconductor field effect transistor (MOSFET) or a floating gate memory. The method of the present invention allows for the fabrication of gate stack structures that are difficult to fabricate using prior art techniques which permits for improved properties and higher performance in field effect devices.

BACKGROUND OF THE INVENTION

Today's integrated circuits include a vast number of electronic devices. Smaller devices are a key to enhance device performance and improve reliability. As MOSFET devices, e.g., insulated-gate field effect transistors, are being scaled down, the technology becomes more complex and new methods are needed to maintain the expected performance enhancement from one device generation to the next.

Gate dielectrics are one of the main problems for field effect device scaling. This is true for both conventional silicon devices and more advanced (e.g., Ge, SiGe, GaAs, InAs, etc.) devices. In order to further enhance the performance of Si-based MOSFETs, high-permittivity ('high-k') dielectrics will most likely replace traditional silicon oxide or oxynitride gate insulators to reduce the gate leakage current, and hence power dissipation. The likely first material of choice in many products will be Hf-based, e.g., Hf oxide ($HfO_2$), Hf silicate (HfSiO), or Hf silicon oxynitride (HfSiON). However, also oxides containing other metal ions such as, for example, Al, Zr, Ti, Ta, or lanthanoid elements are under consideration for the first or later device generations.

As a gate electrode material, either the traditional doped Si, or novel conducting materials ('metals'), e.g., W, Re, TiN, or NiSi, may be implemented. While metal gates in principle allow for a higher gate stack capacitance, and hence faster device performance, much more experience is available with doped Si. Therefore, doped Si may continue to be used, in particular for low power device applications that require low gate leakage, but not necessarily very fast operation.

The situation is even more problematic for field effect devices based on semiconductors other than Si, e.g., Ge, GaAs, etc. Up to now, no reliable high-quality gate dielectric has been found.

In particular, oxidation of these materials results in poor quality oxide layers that may even be water soluble, as is the case for most germanium oxide phases. Also deposited metal oxides with sufficient quality have not yet been demonstrated on alternative substrates. This is, in part, due to interfacial reactions during oxide deposition or during post-processing. Partial success, for example, on III-V semiconductors has only been reported in two cases: (i) functional $Ga_2O_3$(+$Gd_2O_3$)/GaAs gate stacks have been fabricated by molecular beam epitaxy, see, for example, J. Kwo et al., Appl. Phys. Lett. 75, 1116 (2003); and (ii) acceptable electronic properties were also reported for atomic layer deposited $Al_2O_3$ on GaAs, see, for example, P. D. Ye et al., Appl. Phys. Lett. 83, 180 (2003). Such results remain singular and are not fully understood.

But even in the potentially simpler case of Si-based MOSFETs, not all issues with high-k implementation have been resolved, despite intense research and development activities in many laboratories worldwide. Most importantly, in pFETs incorporating Hf-based dielectrics with polycrystalline Si ('polySi') gate electrodes, the threshold voltage ($V_t$) is consistently found to be approximately 0.6 V more negative than for silicon oxide ($SiO_2$) or oxynitride (SiON) based devices. This renders such devices unusable for integration.

There is also a $V_t$ shift for nFETs, by about. 0.2 V towards more positive values. These shifts are probably due to Fermi level pinning at the polySi/dielectric interface. As potential causes, interfacial Hf-Si bonds [C. Hobbs et al., Symp. on VLSI Tech., p. 9 (2003)], oxygen vacancies in the Hf-based dielectric [K. Shiraishi, et al., Symp. on VLSI Tech., p. 108 (2004)], and an interaction of dopants with Hf oxide or silicate defects [A. Kaneko et al., Extended Abstracts of ISSM 2003, p. 56] have been cited. To solve this problem, gate oxide capping layers and post-deposition treatments have been attempted by many groups worldwide, to no substantial effect. While there may be some hope to find a better capping layer or to investigate in more detail the impact of dopant choice and concentration, no solution is known so far.

Also in other respects there is, in principle, room for improvement of field effect devices. For example, the finite dopant concentration and activation in polySi electrodes cause a decrease in gate stack capacitance and hence degraded MOSFET performance ('polySi depletion'). Higher dopant activation than currently used may also be attainable using in-situ doped (and possibly also using implanted) polySi electrodes, at additional cost compared to the regular process, as extra polySi growth, lithography, and reactive ion etch (RIE) steps may be needed. An alternative is the use of metal gate electrodes in place of polySi. Such gate stacks are under development in many industrial laboratories, but are not yet ready for implementation.

Another issue concerns the thermal budget needed for dopant activation. Activating implanted dopants in polySi gate electrodes and in the source and drain regions of a field effect device requires temperatures of ca. 1000° C. or higher. In MOSFET gate stacks involving alternative dielectrics, this often causes undesirable structural changes such as interfacial regrowth of $SiO_2$, dielectric crystallization, phase separation, and/or reactions. Device performance is adversely affected. At added cost, this problem can partially be solved via in-situ doping of polySi during chemical vapor deposition (CVD) growth or by laser annealing. However, such solutions are not yet available for production.

Multilayer dielectric gate stacks ('nanolaminates') have been proposed in order to, for example, optimize capacitance vs. channel mobility in MOSFETs involving novel dielectrics, or to optimize program/erase speeds in nonvolatile floating gate FET memories [J. P. Casperson et al., J. Appl. Phys. 92, 261 (2002)]. However, not all desirable layer sequences may be manufacturable with sufficient quality utilizing conventional growth techniques such as, for example, chemical vapor deposition. A major potential manufacturing issue for certain materials combinations may be insufficient nucleation in atomic layer deposition (ALD), chemical vapor deposition (CVD), or molecular beam epitaxy (MBE) of such materials, in cases in which the surface free energies are unfavorable or the concentration of active nucleation sites is insufficient. This may result in islanded, rough films, potentially of undesirable crystallinity. Surface activation treatments between growing successive layers might be considered. This field is largely unexplored in the case of gate stack films and tunnel barriers.

In view of the above, there is a need for providing a technique for at least partially fabricating a gate stack on a semiconductor substrate that will allow for implementation of various gate materials without sacrificing device performance.

SUMMARY OF THE INVENTION

The present invention provides a method of producing, at least partially, a gate stack of a semiconductor-dielectric-semiconductor device such as a MOSFET or a floating gate memory in which wafer bonding is employed. The present invention thus provides a method for providing increased control over the dielectric-electrode interface in metal oxide semiconductor field effect transistor (MOSFET) gate stacks. Moreover, the method of the present invention provides a technique for fabricating gate structures that have been difficult to fabricate using traditional complementary metal oxide semiconductor (CMOS) processing.

Specifically, and in broad terms, the method of the present invention comprises the steps of:

providing a first and second structure having a major surface respectively, at least one of said first and second structures comprises at least a dielectric material that has a dielectric constant greater than that of silicon dioxide, said dielectric material is a component of a gate stack;

bonding said major surfaces of said first and second structures together to provide a bonded structure containing said dielectric material; and forming a gate stack from said bonded structure that includes at least said dielectric material.

As indicated above, the dielectric material of the present invention is a material whose dielectric constant, k, is greater than 4.0, i.e., the dielectric constant of silicon dioxide. The dielectric material employed in the present invention can thus by referred to herein as a high-k dielectric (k>4.0, preferably greater than 7.0).

The method of the present invention can be used to solve the above-mentioned pFET $V_t$ shift problem, since it ensures that the dielectric electrode interface is of the same quality as that of the channel-dielectric interface. This should prevent Fermi pinning at the forming interface and thus solve the $V_t$ shift problem.

Moreover, to reduce polySi depletion, the method of the present invention enables the replacement of polySi as a gate electrode material by a highly doped (i.e., degenerate) crystalline Si material. In this way, higher dopant activation and concentration can be achieved resulting in better device performance. The only known solution (metal gate electrodes) is not ready for implementation in commercial devices. The present invention enables more facile work function tuning than presently known gate metals. At the same time, if a degenerate Si gate electrode is bonded to the gate dielectric material, thermal dopant activation is not required. This reduces the thermal budget of the stack, while enabling high levels of dopant activation/concentration.

Moreover, the present invention allows for multilayer dielectric stacks (nanolaminates) to be formed by providing two dielectric stacks and then bonding them together. The present invention may potentially enable the fabrication of structures that are otherwise not attainable with sufficient quality.

Moreover, to fabricate non-Si based MOSFETs, an alternative substrate may be passivated chemically and a Si wafer containing, at least partially, a gate dielectric stack may be bonded to it. In this way, quite sharp substrate-dielectric interfaces can be attainable, with dielectrics that may not form well on the alternative substrates. Given the scarcity of functional stacks demonstrated on alternative materials, the present invention might substantially open the field for non-Si based MOSFETs.

DETAILED DESCRIPTION OF THE INVENTION

Figure 1A:
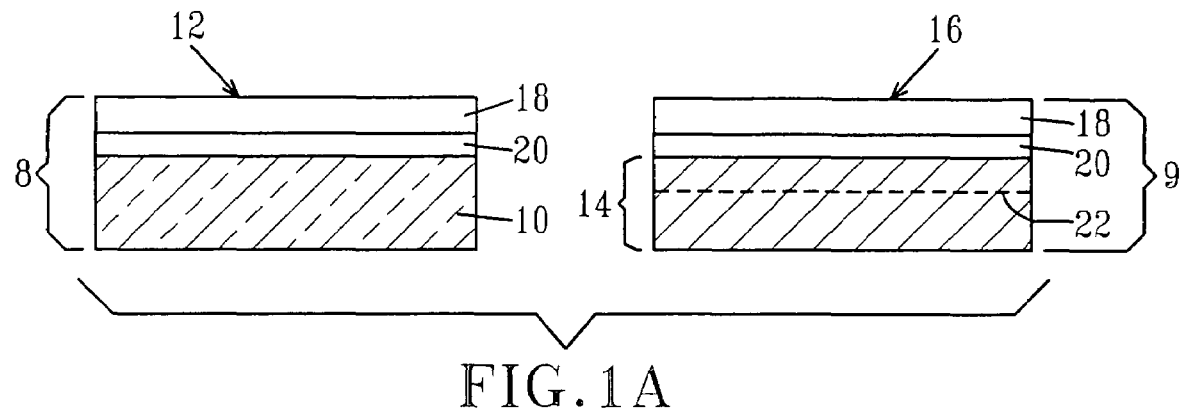
FIGS. 1A-1C are pictorial representations (through cross sectional views) illustrating the basic processing steps employed in the present invention for forming a gate stack.

The present invention, which provides a method of forming a gate stack structure by wafer bonding, will now be described in greater detail by referring to the drawings that accompany the present application. It is noted that the accompanying drawings are not drawn to scale and that like and/or corresponding elements shown in the drawings are referred to by like reference numerals.

Reference is first made to FIG. 1A which depicts a first structure 8 having a major surface 12 and a second structure 9 having a major surface 16 that can be used in the present invention. In accordance with the present invention, at least one of the first structure 8 or the second structure 9 contains a dielectric material 18 that has a dielectric constant that is greater than silicon dioxide (hereinafter 'high-k dielectric' 18). In the embodiment illustrated, both the first structure 8 and the second structure 9 contain the high-k dielectric 18 formed atop an optional native dielectric layer 20. By "native dielectric", it is meant a dielectric layer that predominantly contains oxygen, nitrogen, and elements that compose the underlying materials 10 and 14, respectively (e.g., an $SiO_2$ or silicon oxynitride layer in the case of a Si substrate; or a gallium oxide, arsenic oxide, gallium arsenic oxide, or analogous nitride or oxynitride layer in the case of a GaAs substrate). In addition, this layer may optionally include other atomic species such as, but not limited to: N, Si, Hf, Zr, Al, Ta, Ti, or Gd. It may be formed by air or gas exposure, thermal processing, wet processing, plasma exposure, deposition, or any other technique known to those skilled in the art.

In accordance with the present invention, the first structure 8 includes a first substrate 10, while the second structure 9 includes a second substrate 14.

The first substrate 10 and the second substrate 14 may be comprised of the same or different material including a semiconductor, a conductor or a combination thereof. The term "semiconductor" is used in the present invention to denote a material that has semiconducting properties. Illustrative examples of such semiconductor materials include, but are not limited to: Si, Ge, SiC, SiGe, SiGeC, InAs, InP, GaAs and other III-V or II-VI compound semiconductors. The semiconductor material can also be comprised of a layered semiconductor such as Si/SiGe, silicon-on-insulators (SOIs) or silicon germanium-on-insulators (SGOIs).

The semiconducting material used as the first substrate 10 and/or the second substrate 14 may be strained, unstrained or a combination of strained and unstrained. The semiconducting material can have any crystallographic orientation including, for example, (100), (111) or (110).

The semiconducting material can be undoped, or it can contain a p-type dopant, a n-type dopant or regions including both types of dopants. The doping levels within the semiconductor material can vary depending on the desired end use of the device. The dopants can be activated by annealing so as to form source/drain regions, source/drain extensions and/or well regions within the semiconducting material.

In addition to semiconducting materials, the first substrate 10 and the second substrate 14 may be comprised of a conductor such as an elemental metal, elemental metal nitride, elemental silicide, doped polysilicon or combinations, including multilayers thereof. The conductor can be doped with a dopant ion such As, P, B, Sb, Bi, In, Al, Ga, Tl or mixtures thereof which can shift the work function of a MOSFET device. In embodiments in which multi-conductor layers are used, a barrier layer such as TiN or TaN can be formed between each of the individual conductor layers.

In addition to the above conductive materials, the substrates 10 or 14 can comprise highly doped crystalline Si. By "highly doped", it is meant a doping concentration from about $10^{19}$ to about $10^{22}$ atoms/cm$^3$. The highly doped crystalline Si, as well as the other conductors mentioned above, may be employed as a gate electrode in the final device.

As stated above, the first substrate 10 and the second substrate 14 may comprise a combination of a semiconductor material and a conductive material.

The thickness of the first substrate 10 and the second substrate 14 employed in the present invention may vary and is not critical to the present invention.

In an optional embodiment, such as shown in FIG. 1A, at least one of the substrates 10 or 14 can have an implant region 22, typically implanted with hydrogen or inert gas ions (e.g. helium or argon), which is used in the present invention for thinning one of the substrates. The implant region 22 is formed by a conventional ion implantation process in which ions are implanted into at least one of substrates 10 or 14. The concentration of the ions within the implant region 22 should be sufficient to cause cracks or voids to be formed at the implant region 22 during a subsequent annealing step. Typically, the concentration of ions implanted into at least one of the substrates 10 or 14 is from about $10^{16}$ to about $10^{18}$ atoms/cm$^2$. The depth of the implant region 22 can vary depending on the thickness of the substrate material and the implantation conditions employed. One skilled in the art can select the depth of the implant region 22 formation.

The structures shown in FIG. 1A both contain an optional native dielectric layer 20 on a surface thereof. Although this embodiment is described and illustrated, the present invention also contemplates an embodiment in which optional native dielectric layer 20 is present on only one of the substrates 10 or 14. Alternatively, it is possible to omit the optional native dielectric layer 20 entirely in the present invention.

When present, the optional native dielectric layer 20 is formed utilizing a thermal oxidation process or a conventional deposition process such as, for example, chemical vapor deposition (CVD), plasma enhanced chemical vapor deposition (PECVD), chemical solution deposition, evaporation, atomic layer deposition (ALD), physical vapor deposition, and other like deposition processes. The optional native dielectric layer 20 can also be formed by wet etching and subsequent wet chemical dielectric growth. If present, the optional native dielectric layer 20 has a thickness that typically ranges from about 0.2 to about 3 nm, with a thickness from about 0.4 to about 1.5 nm being more typical.

The high-k dielectric 18 is then formed either on the optional native dielectric layer 20 or directly on one or both of the substrates 10, 14. The high-k dielectric 18 is formed utilizing a deposition process such as chemical vapor deposition (CVD), plasma-assisted CVD, atomic layer deposition (ALD), evaporation, reactive sputtering, chemical solution deposition, molecular beam epitaxy (MBE) and other like deposition processes. The thickness of the high-k dielectric 18 can vary, but typically the high-k dielectric 18 has a thickness from about 0.4 to about 6 nm. More typically, the high-k dielectric 18 has a thickness from about 1.5 to about 4 nm.

The high-k dielectric 18 employed in the present invention includes any dielectric material whose dielectric constant is greater than that of silicon dioxide (>4.0). More typically, the high-k dielectric 18 employed in the present invention has a dielectric constant that is greater than 7.0. Illustrative examples of high-k dielectrics that can be employed as layer 18 include, for example, oxides such as, $HfO_2$, $ZrO_2$, $TiO_2$, $Al_2O_3$; silicates; aluminates; titanates, nitrides and combinations, including multilayers thereof. The dielectrics can be crystalline or non-crystalline. Hf-based materials such as, for example, $HfO_2$, Hf silicate and Hf silicon oxynitride, are particularly preferred.

It should be noted that the surface of each of the substrates 10 and 14 employed in the present invention can be subjected to a cleaning process prior to forming the above layers thereof. Any cleaning process that removes contaminants and/or surface oxides from the surface of the substrates can be employed in the present invention. Such cleaning processes are well known to those skilled in the art. For example, wet treatments utilizing hydrofluoric acid, hydrochloric acid, ammonium hydroxide, sulfuric acid, nitric acid, ammonium sulfide, $H_2O_2$, water, ozonated water, organic solvents, or mixtures thereof, can be used at this stage to clean the surface of the substrates prior to forming the dielectric layers thereon. Alternatively, gas phase or vacuum treatments such as desorption at elevated temperature, cleaning with gas species such as HF or ozone, or plasma treatments may be performed.

It is also possible to treat each of the dielectric layers after formation with an agent that is capable of forming a hydrophilic surface layer on the dielectric layers. Such hydrophilic surfaces are particularly desired atop each of the dielectric surfaces that will be bonded together since it facilitates the bonding process. For example, water treatment and drying or plasma activation can be used for forming a hydrophilic surface for bonding.

Although not shown in the drawings of the present invention, trench isolation regions can be formed into one of the substrates prior to forming the dielectric layers thereon. The trench isolation regions are particularly formed into the substrate that is semiconducting. The trench isolation regions are formed utilizing a conventional process which includes trench definition and etching, optionally lining the trench with a liner material and filling the trench with a trench dielectric such as $SiO_2$, tetraethylorthosilicate (TEOS), or a high-density oxide. An optional densification step and/or a planarization step can be used after filling the trench with a trench dielectric material. In yet another embodiment of the present invention, the trench isolation regions are formed after the bonding process (to be subsequently described).

It should be noted that although, FIG. 1A illustrates two symmetrical structures having the same number of identical layers, the present invention also contemplates embodiments in which two non-symmetrical structures are employed.

The structures 8 and 9 shown in FIG. 1A are then bonded together by brining the two surfaces 12, 16 to be bonded into intimate contact with each other. An external pressure can be applied during and/or after the contact step.

Figure 1B:
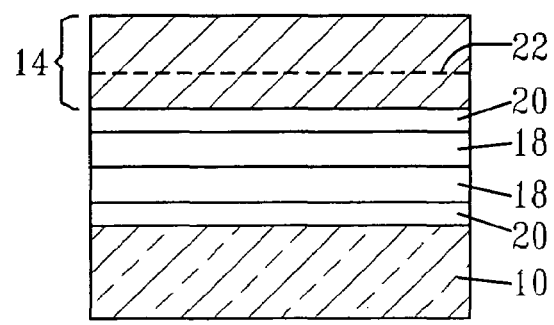

The bonding is performed at nominal room temperature. By "nominal room temperature", it is meant a temperature from about 18° to about 40° C. The bonding may be performed in air, an inert ambient such as He, Ar, Ne, or mixtures thereof, $N_2$, or combinations thereof, or in any other gas environment. Bonding may also be performed in a vacuum. The bonded structure is shown in FIG. 1B.

Following the initial contact bonding, a post-bonding annealing step can optionally be performed at a temperature that strengthens the bonding between the bonded surfaces, without causing crack formation in the implant region 22. Typically, this post-bonding annealing step is performed at a temperature from about 40° to about 1200° C., with a temperature from about 100° to about 1000° C. being more typical. Moreover, the post-bonding annealing step is typically performed for a time period from about 1 min to about 10 days and it may be performed in one of the ambients mentioned above.

A splitting annealing step can now be performed which causes a crack to form at the optional implant region 22 that is capable of separating a portion of one of the substrates that contains the implant region 22. A razor blade or another like means can be used to aid in the separation process. The splitting anneal is performed at a temperature that is higher than that of the optional post-bonding annealing step. Typically, the splitting anneal is performed at a temperature from about 100° to about 1000° C., with a temperature from about 300° to about 600° C. being more typical. The splitting anneal can be performed in one of the above-mentioned ambients for a time period that typically ranges from about 1 min to about 1 day. It should be noted that any of the annealing steps mentioned herein can use various heating regimes including various ramp up rates, soak cycles and cool down rates.

Figure 1C:
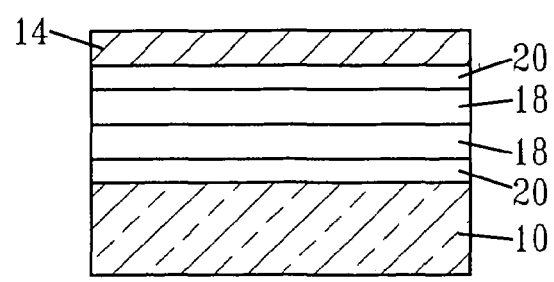

The optional splitting anneal causes thinning of one of the substrates that includes the implant region 22. In the illustration provided, substrate 14 is thinned. Thinning of one of the substrates post bonding may also be achieved by other means, such as etching (wet or dry) or planarization, e.g., chemical mechanical polishing (CMP). A thinned, bonded structure is shown, for example, in FIG. 1C In some embodiments of the present invention, not illustrated, one of the substrates can be entirely removed following the bonding process. The entire removal can be achieved by etching or by planarization.

Notwithstanding whether thinning occurs, or if one of the substrates is entirely removed after bonding, conventional CMOS process steps can be used to form at least one FET on the surface of the resultant structure.

In a preferred embodiment, substrate 10 is semiconducting, high-k dielectric 18 is a Hf-based dielectric, and substrate 14 is doped polySi. In this embodiment, the forming CMOS process can including patterning of the doped polySi, formation of sidewall spacers and, if not previously formed, formation of source/drain regions. Silicide regions can then be formed, followed by the formation of at least one interconnect level that includes an interconnect dielectric that has conductively filled lines and vias. The conductively filled vias are in contact with the silicide regions previously formed.

In another preferred embodiment, substrate 10 is semiconducting, high-k dielectric 18 is a Hf-based dielectric and substrate 14 is a highly doped crystalline Si layer. In this embodiment, the forming CMOS process can including patterning of the highly doped crystalline Si layer, formation of sidewall spacers and, if not previously formed, formation of source/drain regions. Silicide regions can then be formed, followed by the formation of at least one interconnect level that includes an interconnect dielectric that has conductively filled lines and vias. The conductively filled vias are in contact with the silicide regions previously formed.

In yet another embodiment of the present invention, a passivation anneal (performed in molecular, atomic, or ionic hydrogen or deuterium, or in a mixture of these species with nitrogen, inert gases, or oxygen) can be used after bonding for interfacial trap passivation. This anneal is typically performed at a temperature from about 200° to about 800° C., with a temperature from about 300° to about 600° C. being more typical.

In addition to MOSFETs, the present method can also be used for forming a gate stack for a nonvolatile memory device.

Exemplary Implementation of the Present Invention

In this exemplary implementation, substrate 10 is a substrate wafer and substrate 14 is a gate wafer. Substrate 10 may or may not have undergone dopant implantation. Substrate 14 is a highly doped conductor, such as polySi or crystalline Si, which material serves as the gate electrode in the resultant device. Also, substrate 14 may include a hydrogen implant region 22 in order to enable layer splitting to provide a thin gate electrode after bonding.

A thin native dielectric film 20 is formed on both substrates followed by the formation of a high-k dielectric 18 such as $HfO_2$, Hf silicate, or Hf silicon oxynitride. The surface of the high-k dielectric 18 formed in each structure can be treated to enhance bonding. The surfaces containing the high-k dielectric 18 are then brought into intimate contact and are thus bonded together. In accordance with this embodiment, the substrate 14 is formed atop the substrate 10 so that a surface of the gate wafer, e.g., the conductor, is exposed.

Post-bonding annealing and layer splitting, as described above, are then performed. The resultant structure comprises (using the reference numerals described above) substrate 10, optional native dielectric layer 20, high-k dielectric 18, and a thin gate electrode which is made up of a portion of substrate 14, i.e., highly doped polySi or highly doped crystalline Si.

While the present invention has been particularly shown and described with respect to preferred embodiments thereof, it will be understood by those skilled in the art that the forgoing and other changes in forms and details may be made without departing from the spirit and scope of the present invention. It is therefore intended that the present invention is not limited to the exact forms and details described and illustrated, but fall within the scope of the appended claims.

What we claim as new is:

1. A method of forming a gate stack for a semiconductor electronic device comprising:
    providing a first structure and a second structure having a major surface respectively, at least one of said first and second structures comprises a substrate having a native dielectric material located thereupon and at least an other dielectric material that has a dielectric constant greater than that of silicon dioxide located upon the native dielectric material, and at least the other of the first and second structures comprises a substrate having a native dielectric material located thereupon, said native dielectric material and said other dielectric material are a component of a gate stack;
    bonding said major surfaces of said first and second structures together to provide a bonded structure containing said native dielectric material and said other dielectric material; and
    forming a gate stack from said bonded structure that includes at least said native dielectric material and said other dielectric material.

2. The method of claim 1 wherein said first structure includes a first substrate comprising a semiconducting material, a conductor or a combination thereof.

3. The method of claim 1 wherein said second structure includes a second substrate comprising a semiconducting material, a conductor or a combination thereof.

4. The method of claim 1 wherein said first structure comprises a semiconducting substrate and said second substrate comprises a conductive substrate.

5. The method of claim 4 wherein said semiconducting substrate comprises Si, Ge, SiC, SiGeC, InAs, InP, GaAs, Si/SiGe, a silicon-on-insulator, or a silicon germanium-on-insulator.

6. The method of claim 4 wherein said conductive substrate comprises an elemental metal, an elemental nitride, an elemental silicide, doped amorphous silicon, doped polysilicon, doped crystalline Si or combinations and multilayers thereof.

7. The method of claim 6 wherein said conductive substrate comprises doped polysilicon or doped crystalline Si.

8. The method of claim 4 wherein said conductive substrate includes a hydrogen or inert gas implant region.

9. The method of claim 1 further comprising performing a passivation anneal in the presence of at least one of molecular hydrogen, atomic hydrogen, ionic hydrogen, molecular deuterium, atomic deuterium and ionic deuterium interposed between the bonding step and the forming step.

10. The method of claim 1 wherein each structure includes said native dielectric layer to provide a gate stack where a gate to gate dielectric interface has the same quality as a channel to gate dielectric interface.

11. The method of claim 1 wherein said bonding is performed by bringing the majority surfaces of the two structures into intimate contact.

12. The method of claim 11 wherein said bonding is performed in the presence of an external pressure.

13. The method of claim 1 wherein said bonding is performed at a temperature from about 18° to about 40° C.

14. The method of claim 1 further comprising a post-bonding annealing step that is performed after said bonding.

15. The method of claim 14 wherein said post-bonding annealing step is performed at a temperature from about 40° to about 1200° C.

16. The method of claim 1 further comprising a splitting annealing step that is performed after said bonding.

17. The method of claim 16 wherein said splitting annealing step is performed at a temperature from about 100° to about 1000° C.

18. The method of claim 1 further comprising a thinning step that is performed between said bonding and said forming steps.

19. The method of claim 18 wherein said thinning step comprises a splitting anneal, etching or planarization.

20. The method of claim 1 wherein said other dielectric material has a dielectric constant greater than 4.0 and comprises an oxide, silicate, aluminate, titanate, nitride or combination thereof.

21. The method of claim 1 wherein said other dielectric material comprises $HfO_2$, Hf silicate or Hf silicon oxynitride.

22. A method of forming a gate stack for a semiconductor electronic device comprising:
providing a first structure that comprises a semiconducting substrate including a native dielectric material that has at least an other dielectric material having a dielectric constant that is greater than $SiO_2$ located thereon;
providing a second structure that comprises a conductive substrate including a native dielectric material that has at least an other dielectric material having a dielectric constant that is greater than $SiO_2$ located thereon;
bonding the exposed other dielectric material of the first structure to the exposed other dielectric material of the second structure to provide a bonded structure;
forming a gate stack from said bonded structure; and
forming a field effect transistor semiconductor electronic device that uses the gate stack, where the field effect transistor semiconductor electronic device has no threshold voltage shift.

23. The method of claim 22 wherein said semiconducting substrate comprises Si, Ge, SiC, SiGeC, InAs, InP, GaAs, Si/SiGe, a silicon-on-insulator, or a silicon germanium-on-insulator.

24. The method of claim 22 wherein said conductive substrate comprises an elemental metal, an elemental nitride, an elemental silicide, doped polysilicon, doped crystalline Si or combinations and multilayers thereof.

25. The method of claim 24 wherein said conductive substrate comprises doped polysilicon or doped crystalline Si.

26. The method of claim 22 wherein said conductive substrate includes a hydrogen implant region.

27. The method of claim 22 further comprising performing a passivation anneal in the presence of at least one of molecular hydrogen, atomic hydrogen, ionic hydrogen, molecular deuterium, atomic deuterium and ionic deuterium.

28. The method of claim 22 wherein said bonding is performed by bringing the dielectric materials of the two structures into intimate contact.

29. The method of claim 28 wherein said bonding is performed in the presence of an external pressure.

30. The method of claim 22 wherein said bonding is performed at a temperature from about 18° to about 40° C.

31. The method of claim 22 further comprising a post-bonding annealing step that is performed after said bonding.

32. The method of claim 31 wherein said post-bonding annealing step is performed at a temperature from about 40° to about 1200° C.

33. The method of claim 22 further comprising a splitting annealing step that is performed after said bonding.

34. The method of claim 33 wherein said splitting annealing step is performed at a temperature from about 100° to about 1000° C.

35. The method of claim 22 further comprising a thinning step that is performed between said bonding and said forming steps.

36. The method of claim 35 wherein said thinning step comprises a splitting anneal, etching or planarization.

37. The method of claim 22 wherein said other dielectric material has a dielectric constant greater than 4.0 and comprises an oxide, silicate, aluminate, titanate, nitride or combination thereof.

38. The method of claim 22 wherein said other dielectric material comprises $HfO_2$, Hf silicate or Hf silicon oxynitride.

* * * * *